United States Patent [19]
Sniderman et al.

[11] Patent Number: 6,028,996
[45] Date of Patent: Feb. 22, 2000

[54] METHOD AND APPARATUS FOR VIRTUALIZING SYSTEM OPERATION

[75] Inventors: Bryan Sniderman, Thornhill; William Hopkins, East York, both of Canada

[73] Assignee: ATI Technologies, Inc., Thornhill, Canada

[21] Appl. No.: 08/819,923

[22] Filed: Mar. 18, 1997

[51] Int. Cl.$^7$ .................................................. G06F 9/455
[52] U.S. Cl. .............................. 395/500.49; 395/500.45; 395/500.44; 395/500.35; 714/28
[58] Field of Search ...................... 395/500.35, 500.44, 395/500.45, 500.46, 500.48, 500.49, 500.42; 364/489, 578; 714/28

[56] References Cited

U.S. PATENT DOCUMENTS

| | | | |
|---|---|---|---|
| 5,329,471 | 7/1994 | Swoboda et al. | 395/500.44 |
| 5,546,562 | 8/1996 | Patel | 395/500.35 |

OTHER PUBLICATIONS

Caerts, C.; Lauwereins, R.; Peperstraete, J. A.; "PDG: A Process–level Debugger for Concurrent Programs in the GRAPE Rapid Prototyping Environment", Proceedings of the Fourth International Workshop on Rapid System Prototyping, pp. 17–30, Jun. 30, 1993.

*Primary Examiner*—Kevin J. Teska
*Assistant Examiner*—Douglas W. Sergent
*Attorney, Agent, or Firm*—Markison & Reckamp PC

[57] ABSTRACT

A method and apparatus for emulating operation of a complex circuit within a system, thereby creating a virtual system, is achieved within a system that includes a central processing unit (CPU), system memory, at least one functional module, and an emulator that includes a circuit simulator, a virtual coupler, and an evaluation module. The circuit simulator simulates the functionality of the complex circuit, includes an individual system identifier, and is operably coupled to, and substantially controlled by, the at least one functional module. At system start-up, or at initiation of a simulation test, the system determines its configuration by obtaining the individual system identifiers of each system element. Because the circuit simulator has a system identifier, it is treated by the system as a real entity. As such, when the CPU requests the function of the complex circuit to be performed, the CPU provides its request to the at least one functional module. The requests are also received by the virtual coupler which interprets the requests as being directed to the circuit simulator. At this point, the virtual coupler couples the at least one functional module to the circuit simulator such that operational instructions and/or operand data processed by the functional module are provided to the circuit simulator. The circuit simulator processes the operand data based on the operational instructions and provides the manipulated data back to the system.

24 Claims, 9 Drawing Sheets

METHOD AND APPARATUS FOR VIRTUALIZING SYSTEM OPERATION

FIELD OF THE INVENTION

This invention relates generally to system development and diagnostics thereof and more particularly to a method and apparatus for virtualizing system operation prior to, and in conjunction with, complex circuit hardware and/or firmware being available.

BACKGROUND OF THE INVENTION

Today, almost every type of electronics device includes some type of digital processing circuit. For example, microwave ovens, refrigerators, coffee makers, computer game systems, watches, televisions, and personal computers, to mention just a few. Manufacturers developing such electronic devices use digital processing circuits to produce products that are easier to use, provide more features, and in smaller packages, all with the intent of capturing a bigger share of the relevant market. As many marketing studies have shown, the first to market usually captures, and maintains, a majority share of the market, provided, of course, that their product works and it is what the market wants. Thus, it is very important to most manufacturers to be first to market. But, with products being developed with more advanced technologies, more complex circuits are being used which take more time to develop and to test, adding to the development time and, as result, delaying the time to market. Manufacturers are thus caught in a catch-22 situation: rush a product to market that many not be filly functional or delay market entry to make sure the product works.

This catch-22 scenario is very prevalent in the personal computer market because of the very short life cycle (Eg. 18 to 24 months) of personal computers. Thus, for computer manufacturers and computer component manufacturers it is very critical to continue to reduce the time to market, but still provide advanced features. Such demanded features include greater processing speed, more memory, better video graphics, better Internet connection, all in smaller and lighter packages. To meet these market demands, most computer manufacturers and computer component manufacturers use Application Specific Integrated Circuits (ASIC).

While ASICs meet the market demand for better performance in smaller packages, they take time to design, develop, and test. As with any integrated circuit (IC) development, once the circuit has been designed and a mask created, the ASIC needs to be fabricated and then tested. It is not uncommon for the ASIC to fail the initial test, requiring the circuit to be modified, a new mask created, and the ASIC to be re-fabricated. Once the ASIC passes testing, it is ready for incorporation in the system, which may be a personal computer, television, video graphics circuit, video game system, etc. But, until the ASIC is functional, the system cannot be completely tested, delaying time to market. The time to market is further delayed when the ASIC does not completely work within the system and revisions need to be made to the ASIC and/or the system.

Attempts have been made to simulate the operation of the ASIC (before the ASIC is available) such that the system can be tested. Many problems arose with these attempts. For example, the system was reworked such that it would know that it was communicating with an ASIC simulator and not the actual ASIC. The rework done to the system affected the environment between the system and the ASIC simulator, such that the testing did not effectively simulate the ASIC operation within the system. The problems continued when the ASIC was available, because the system had to be reworked to now accommodate the actual ASIC, which took time and limited the testing to either the actual ASIC or the ASIC simulator. Another problem arose when the ASIC simulator software lagged behind the ASIC.

As a result of the above mentioned problems, most system developers have shied away from using ASIC simulators. They use the serial testing method of developing the ASIC supporting and interfacing circuitry and software based on the specifications of the ASIC, which sometimes change. Then, when the ASIC is available, the system developers test the system with the ASIC, making modifications were needed. But this approach adds to the time to market, which may mean that a manufacturer enters the market late.

Therefore, a need exists for an ASIC emulator, and method thereof that does not require the system to be reworked to test the system with the ASIC emulator, and one that can be coupled into the system at the same time as the actual ASIC.

DETAILED DESCRIPTION OF A PREFERRED EMBODIMENT

Generally, the present invention provides a method and apparatus for establishing a virtual system such that system operation can be simulated prior to, and simultaneously with, the availability of complex circuitry. Such a virtual system includes a central processing unit (CPU), system memory, at least one functional module, and an emulator that includes a circuit simulator, a virtual coupler, and an evaluation module. The circuit simulator simulates the functionality of a complex circuit, includes an individual system identifier, and is operably coupled to, and substantially controlled by, the at least one functional module.

At system start-up, or at initiation of a simulation test, the system determines its configuration by obtaining the individual system identifiers of each system element. Because the circuit simulator has a system identifier, it is treated by the system as a real entity. As such, when the CPU requests the function of the complex circuit to be performed, the CPU provides its request to the at least one functional module. The requests are also received by the virtual coupler which interprets the requests as being directed to the circuit simulator. At this point, the virtual coupler couples the at least one functional module to the circuit simulator such that operational instructions and/or operand data processed by the functional module are provided to the circuit simulator. The circuit simulator processes the operand data based on the operational instructions and provides the manipulated data back to the system. With such method and apparatus, systems can be tested prior to, and simultaneously with, the availability of custom designed complex circuits, such as Application Specific Integrated Circuits (ASIC). Such testing allows the inter-operable circuits of the ASIC to be tested without the actual ASIC such that satisfactory performance can be determined. The testing, if it determines that the performance was unsatisfactory, allows for corrective measures to be taken in the ASIC and/or inter-operable coupled circuits before the actual ASIC is available.

Figure 1:
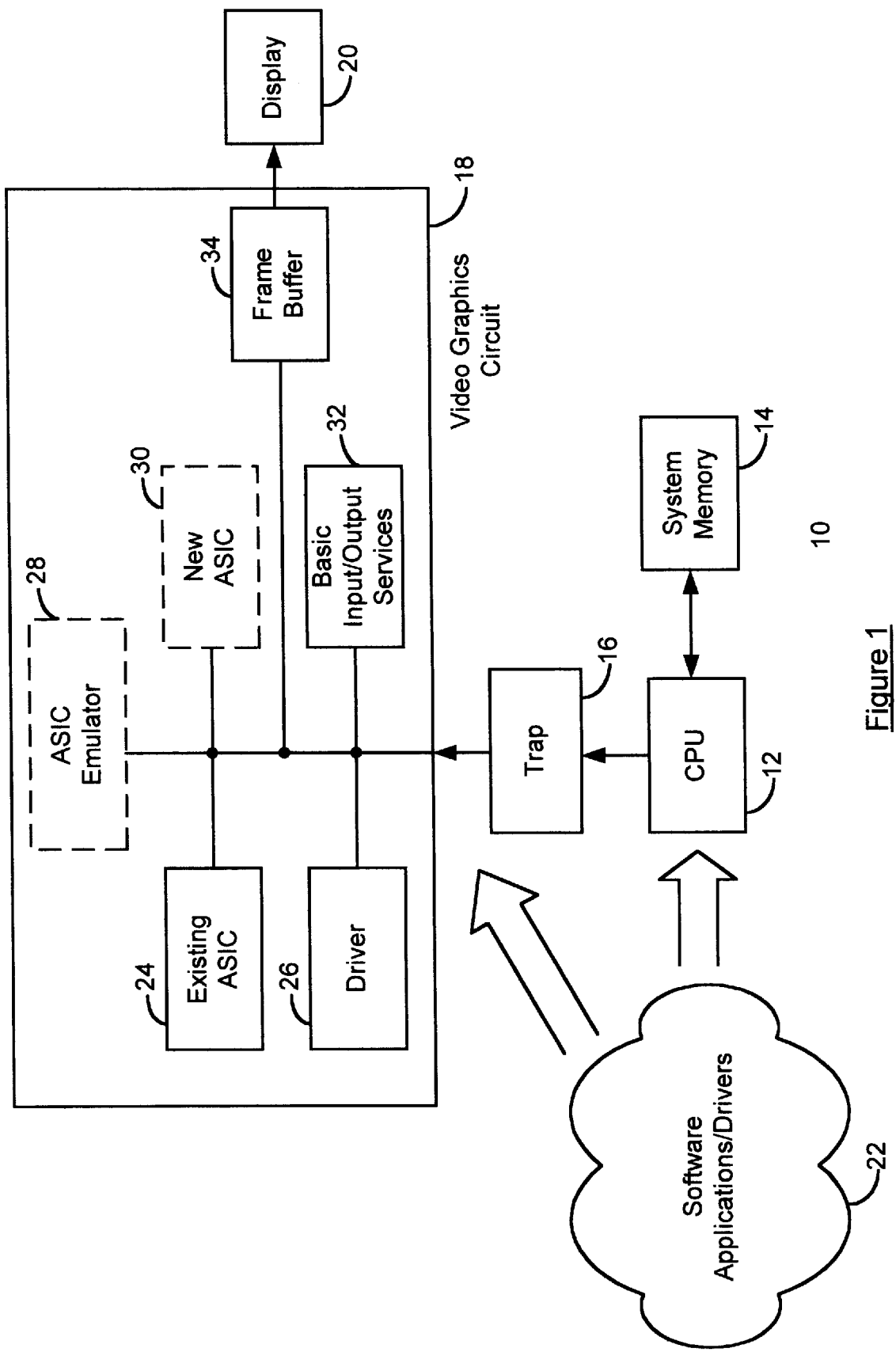
FIG. 1 illustrates a schematic block diagram of a virtual system which is in accordance with the present invention.

The present invention can be more fully described with reference to FIGS. 1–9. FIG. 1 illustrates a schematic block diagram of a virtual system 10 that includes a central processing unit (CPU) 12, system memory 14, a trap circuit 16, a video graphics circuit 18, a display 20, and software applications and software drivers 22. The video graphics circuit 18 includes an existing ASIC 24, a driver 26, an ASIC emulator 28, a new ASIC 30, a basic input/output services (BIOS) module 32, and a frame buffer 34. As shown, the virtual system 10 may be any type of system that processes data and displays the processed data. For example the virtual system 10 may be representative of, but not exclusively limited to, a personal computer, a video game system, a personal digital assistant (PDA), a television monitor, work station, or other type of computer. Note that the CPU 12 needs to have some inherent trapping capabilities.

The representation of the system 10 in FIG. 1 is reflective of the ever increasing pace at which new products and features are being introduced. Thus, even though the existing ASIC 24 may be the state-of-the-art circuit, a more advanced, or new, ASIC is already being developed. In the system 10, the CPU 12 processes data based on operational instructions from a software application being executed and routes associated video driver operational instructions to the video graphics circuit 18. The trap circuit 16 monitors each time data and/or operational instructions are provided to the video graphics circuit 18, and depending on which ASIC, or ASIC simulator is being used, the trap circuit 16 routes the data and/or operational instructions to the appropriate device. By having the option of routing the data and/or the operational instructions to any one of the three ASICs (i.e., the existing ASIC 24, the ASIC emulator 28, and the new ASIC 30), the system 10 can be tested with any one of the ASICs installed without having to make any modifications to the system 10.

With the optional coupling of the ASIC, the inter-operable circuits, such as the driver, the BIOS module 32, and the frame buffer 34, can be tested as to how the modifications made to their circuitry will work with the new ASIC 30 prior to its availability. It is somewhat of a fact that by changing one element in a system, other elements will be effected and thus require change to enable the system in a desirable way. Such is the case for video graphic circuits. When the video processing section, which is usually embedded in an ASIC, changes, the driver software and the BIOS software need to be changed as well. The present invention allows for the changes to the driver software and the BIOS software to be tested without the new ASIC 30 by using the ASIC emulator 28. Thus, development and subsequent testing of a new video graphics circuit can be done in parallel without the disadvantages of prior art circuit simulators.

As one skilled in the art will readily appreciate, the CPU 12 may be replaced by or coupled with a digital signal processor (DSP), a microprocessor, a microcontroller, or any other type of device that processes digital data based on operational instructions. Such a skilled person will also appreciate that any type of advanced, or complex, circuit could be simulated in this manner. For example the ASIC emulator could simulate the operation of a new microprocessor, DSP, microcontroller, any type of device that processes digital data based on operational instructions, or any complex circuit that would function as a coprocessor.

Figure 2:
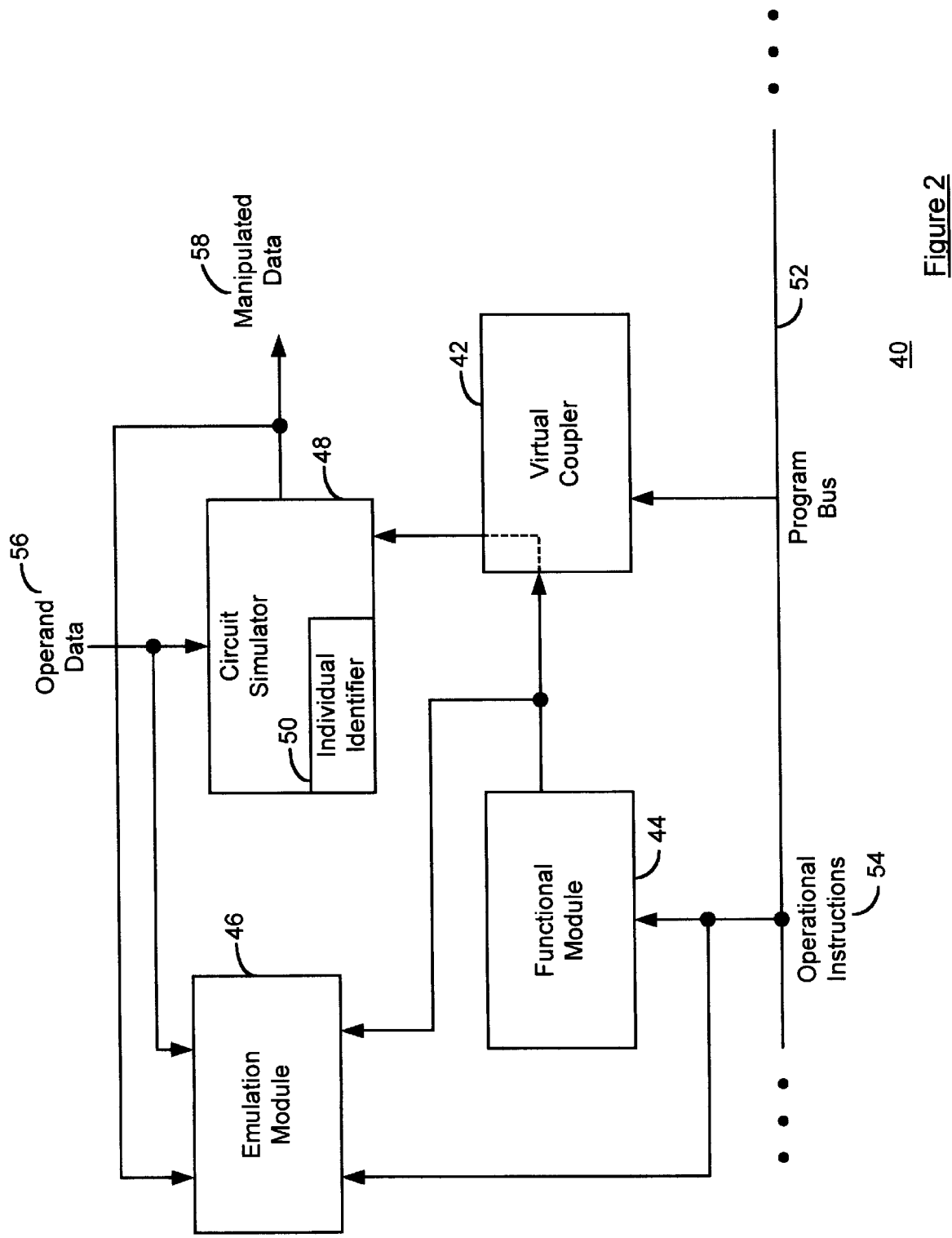
FIG. 2 illustrates a schematic block diagram of an emulator which is in accordance with the present invention.

FIG. 2 illustrates a schematic block diagram of an emulator 40 that may be used to emulate, and/or simulate, any complex circuit that processes operand data 56 based on operational instructions 54 to produce manipulated data 58. For example, the emulator 40 may simulate the function of a video graphics processor, a microprocessor, or microcontroller. The emulator 40 includes a virtual coupler 42, a functional module 44, an evaluation module 46, and a circuit simulator 48. In operation, the emulator 40 would be placed into an existing system, such as a personal computer, and when the computer was booted-up, rebooted, or initiated a simulation test, the circuit simulator 48 would be recognized as a system component, via its individual identifier 50. For example, when a computer is booted-up, it determines what peripheral devices, whether internal or external to the computer, are part of the system configuration. As such, the system identifies the hard drive, disk drive, CD drive, video graphics card, etc. With the emulator 40 installed, the circuit simulator 48 will appear to the system as just another peripheral device.

Once the circuit simulator 48 has been recognized like any another peripheral device, the computer can perform any software application the user desires and be able to test the circuit simulator's 48 performance with the rest of the system. Such verification of operation can be performed by the evaluation module 46, which monitors the inputs and outputs of the circuit simulator 48 to determine if the proper responses are being generated. If not, the evaluation module 46 may provide information as to the reason for the unsatisfactory performance and what corrective action needs to be taken.

Continuing with the operation, the virtual coupler 42 of emulator 40, is coupled to the program bus 52 and detects when operational instructions are intended for the circuit simulator 48. As mentioned above, the system is not reprogrammed to recognize the presence of the circuit simulator. To the system, it is addressing an existing module when performing an existing software application. For example, assume that the circuit simulator 48 is programmed to function as a video processor, the functional module is a video graphics driver, and the software application being executed is word processing. As the computer is processing the word processing software, the CPU repeatedly sends out commands to display a particular character or symbol. In normal operation, this command would go to a video graphics driver which would generate the appropriate response and provide it to the existing video graphics processor. But, with the emulator 40 installed, the virtual coupler 42 detects the command and couples the video graphics driver to the circuit simulator 48 instead of the existing video graphics processor, thus the appropriate responses are provided to the circuit simulator 48 such that it may produce the manipulated data 58.

Figure 3:
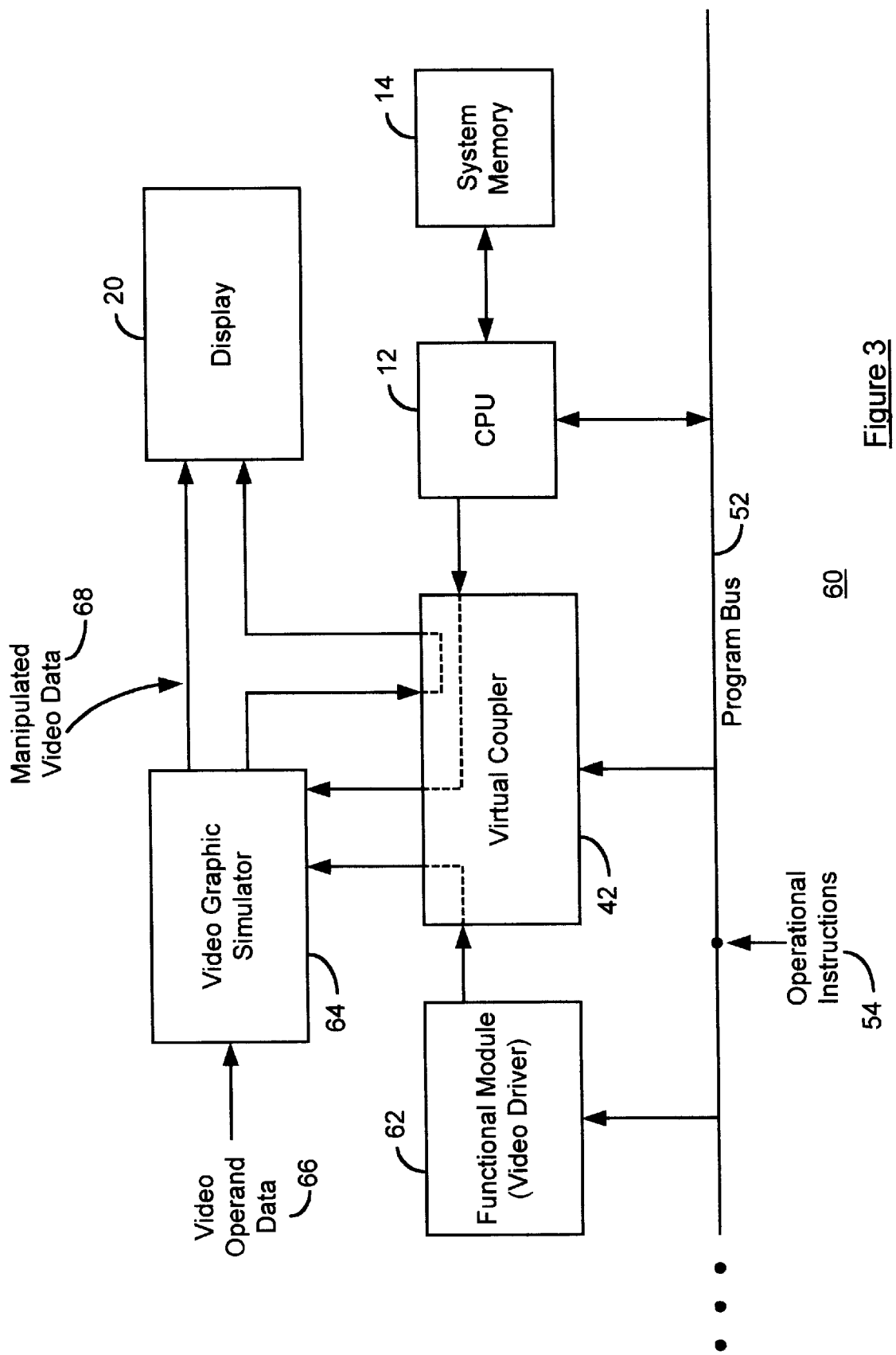
FIG. 3 illustrates a schematic block diagram of an alternate virtual system which is in accordance with the present invention.

FIG. 3 illustrates a schematic block diagram of an alternate virtual system 60 that includes a CPU 12, system memory 14, a virtual coupler 42, a functional module 62 (which may be a video driver), a video graphics simulator 64, and a display 20. The display 20 may include the frame buffer, which would then require the virtual coupling. If, however, the frame buffer is within the video graphics simulator 64, the video graphics simulator 64 would be directly coupled to the display 20. In operation, when the CPU 12 is processing data for display, it provides display commands onto the program bus 52. The virtual coupler 42 and the functional module 62 receive the commands. The virtual coupler 42, when it recognizes that the command is for a video display, couples the functional module 62 to the video graphics simulator 64 and also couples the video graphics simulator to the display 20. As such, the processing done by the functional module 62, based on the commands, is routed to the video graphics simulator 64 which processes video operand data 66 to produce the manipulated data 68. The manipulated data 68 is then provided to the display 20.

As shown, the video operand data 66 is received by the video graphics simulator 64 without indication as to its source. This was intentional to indicate that the data 66 may come from a plurality of sources, such as the CPU 12, an external video source such as a VCR player, or any other devices that can provide video data to a computer system for display. Regardless of how the video operand data 66 was received, the video graphics simulator 64 processes it, based on the information received from the functional module 62, to produce the manipulated data 68. The resulting manipulated data 68, which is primarily information ready for display, such as pixel information, is the measure as to whether the system is functioning properly with the simulator 64 installed and whether it will function properly with the new ASIC. If the manipulated data 68 provides the desired visual effects to the display 20, then the system is functioning properly with the simulator 64 installed, otherwise, the system 60 is not performing properly and corrective action needs to be taken.

Figure 4:
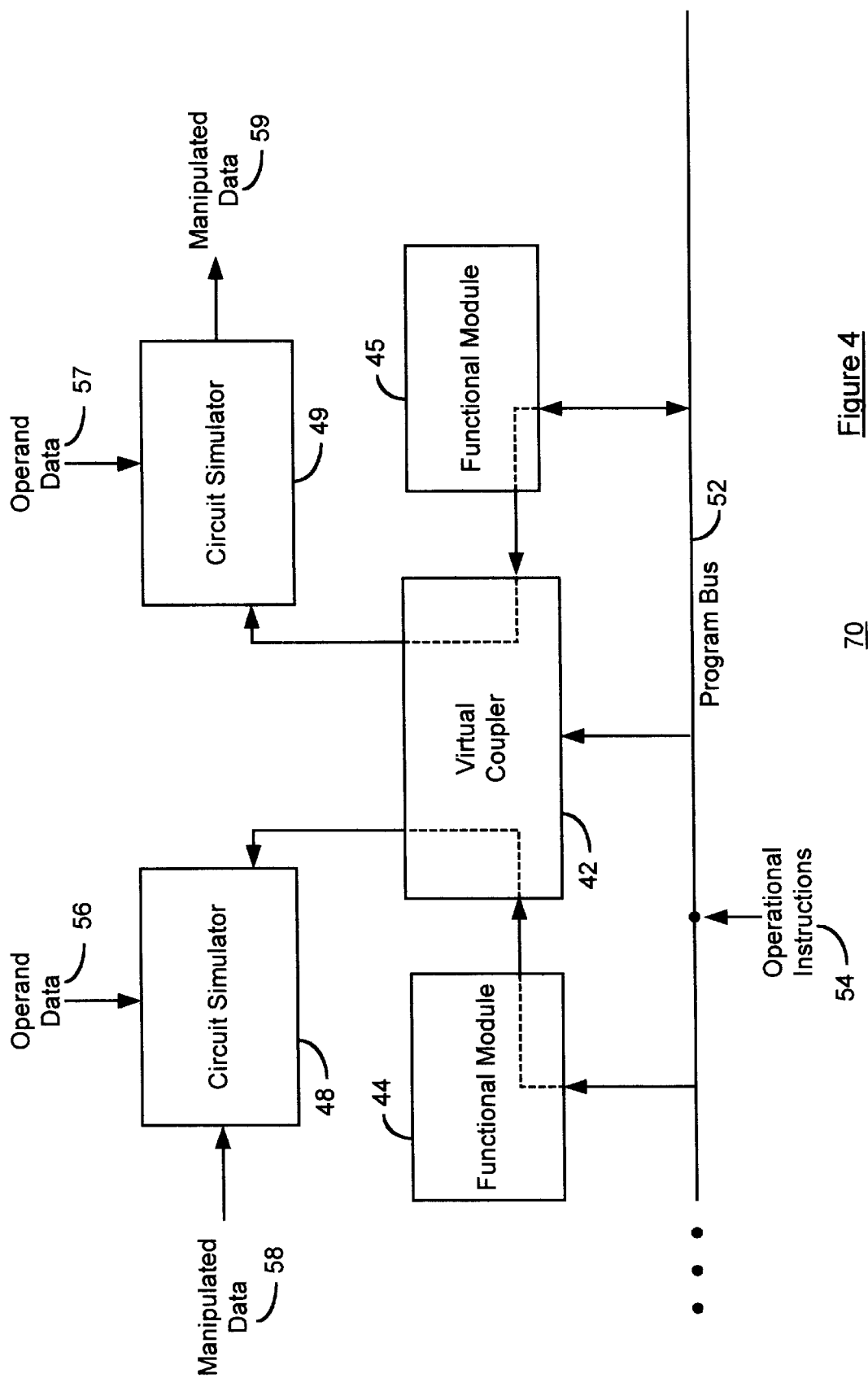
FIG. 4 illustrates a schematic block diagram of an alternate emulator which is in accordance with the present invention.

FIG. 4 illustrates a schematic block diagram of an alternate emulator 70 that includes a virtual coupler 42, a first functional module 44, a first circuit simulator 48, a second function module 45, and a second circuit simulator 49. With this emulator 70, two or more new complex circuits can be tested within a system simultaneously or independently. As such, the first or second circuit simulators 48 and 49 could be representing a video graphics circuit, a DSP, a microprocessor, etc., while the functional modules 44 and 45 may be a device driver, a software application, firmware, or micro-code. The particular embodiment of the functional module 44 or 45 will depend on the circuit simulator 48 or 49 it is associated with. For example, if the circuit simulator is a video graphics simulator, the associated functional module will be a device driver. If however, the circuit module is a DSP, the functional module will be micro-code.

In operation, the virtual coupler 42 monitors the program bus 52 for operational instructions 54 that impact either the first or second circuit simulators 48 or 49. When the virtual coupler 42 recognizes an operational instruction 54 that impacts the first circuit simulator 48, the virtual coupler 42 virtually couples the first functional module 44 to the first circuit simulator 48. When this virtual coupling is provided, the first circuit simulator 48 receives operand data 56 and produces therefrom, based on information received from the first functional module 44, manipulated data 58. Similarly, when the virtual coupler 42 recognizes an operational instruction 54 that impacts the second circuit simulator 49, the virtual coupler 42 virtually couples the second functional module 45 to the second circuit simulator 49. When this virtual coupling is provided, the second circuit simulator 49 receives operand data 57 and produces therefrom, based on information received from the second functional module 45, manipulated data 59.

Figure 5:
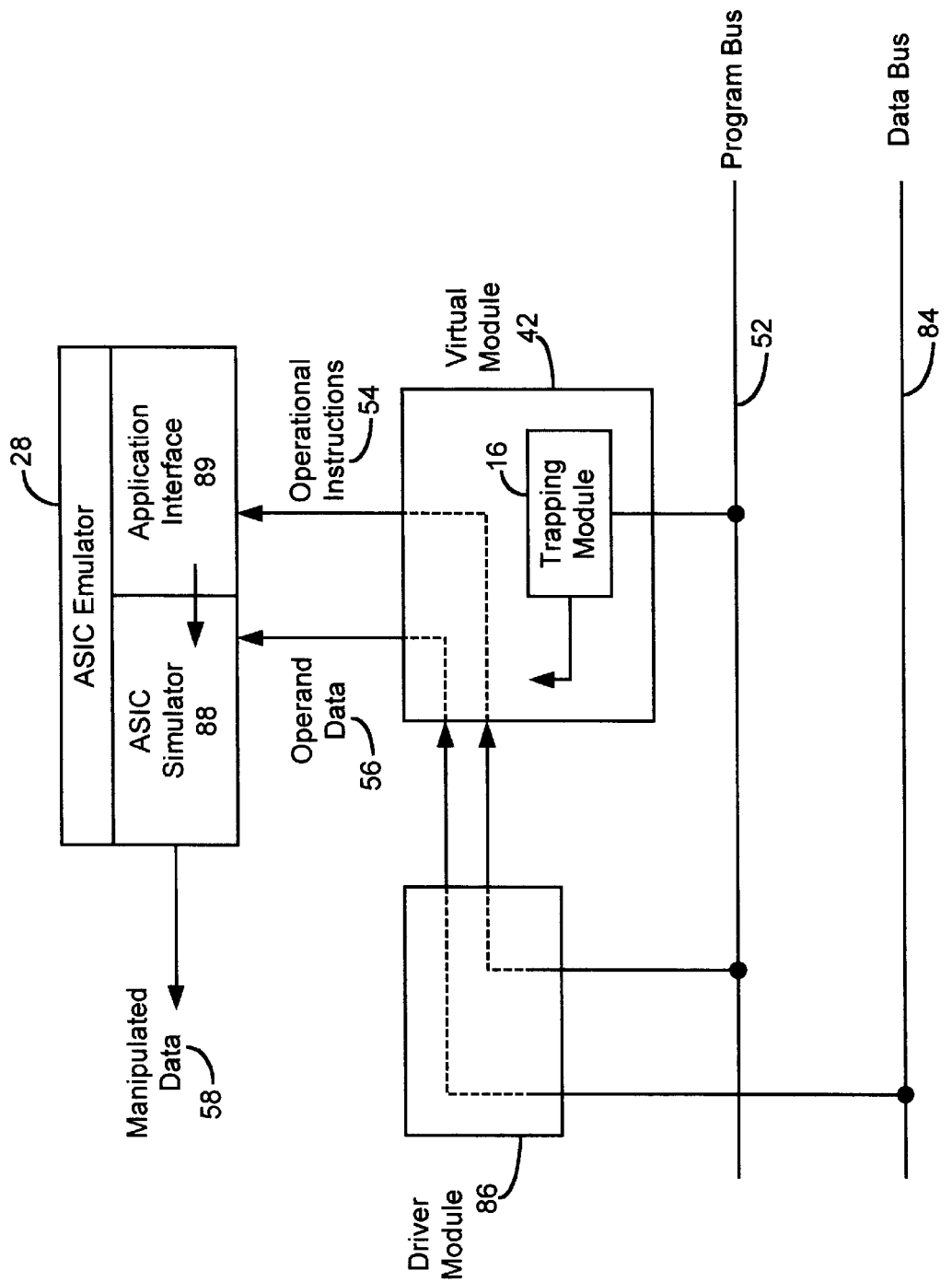
FIG. 5 illustrates a schematic block diagram of an ASIC emulator which is in accordance with the present invention.

FIG. 5 illustrates a schematic block diagram of an ASIC emulator 80 that includes an ASIC emulator 28, a driver module 86, a virtual module 42, a program bus 52, and a data bus 84. The ASIC emulator 28 includes an ASIC simulator 88 and an application interface 89. The virtual module 42 is shown to include the trapping circuit 16. In this configuration, the virtual module 42, via the trapping module 16, monitors the program bus 52 for operational instructions that impact the ASIC emulator 28. When such operational instructions are detected, the virtual module couples the driver module 86 to the ASIC emulator 28. As the driver module 86 receives operational instructions 54 from the program bus 52, it provides them to the application interface 89, via the virtual module. When the driver module 86 receives operand data from the data bus 84, it provides, via the virtual module 42, the data 56 to the ASIC simulator 88, which produces manipulated data 58 from the operand data 56 based on the operational instructions 54. Note that in this embodiment, as in the others, the function of the driver module 86, in layman's terms, is to tell the ASIC, or ASIC simulator what to do and how to do it.

Figure 6:
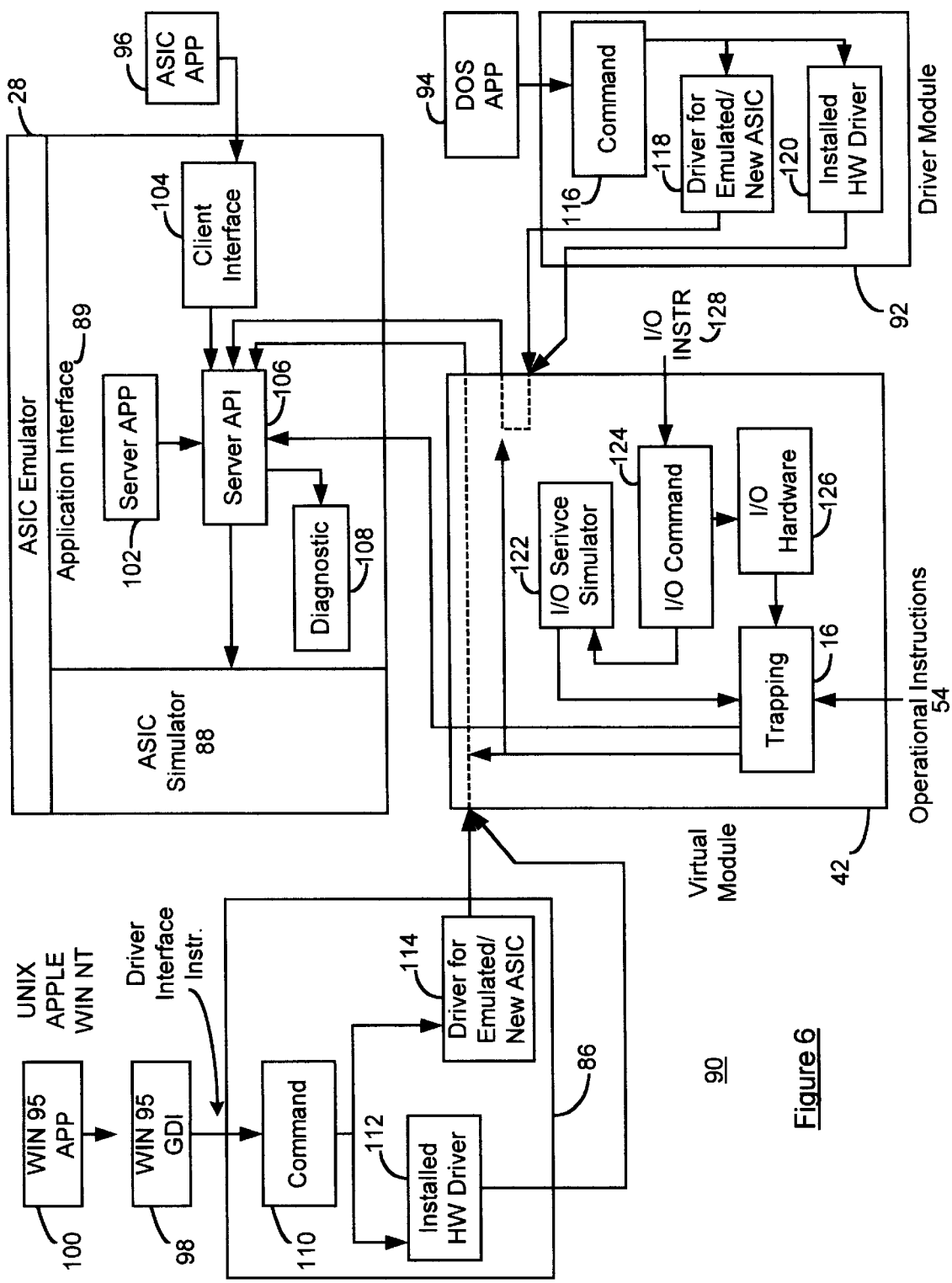
FIG. 6 illustrates a schematic block diagram of an alternate ASIC emulator which is in accordance with the present invention.

FIG. 6 illustrates a schematic block diagram of an alternate ASIC emulator system 90 that includes a virtual module 42, an ASIC emulator 28, a first driver module 86, a second driver module 92, an ASIC application module 96, a Windows 95 (trademark of Mcrosoft) application module 100, a Windows 95 Graphical Drawing Interface (GDI) 98, and a DOS application module 94. The ASIC emulator 28 is shown to include an ASIC simulator 88 and an application interface 89 which, in turn, includes a server application module 102, a server application interface (API) 106, a client interface module 104, and a diagnostic module 108. The virtual module 42 is shown to include the trapping circuit 16, an input/output service simulator 122, an input/output (I/O) command module 124, and an I/O hardware circuit (i.e., an existing I/O circuit) 126. The first driver module 86 is shown to include a command module 110, a driver for the emulated/new ASIC module 114, and an installed hardware driver 112. The second driver module 92 is shown to include a command module 116, a driver for the emulated./new ASIC module 118, and an installed hardware driver 120.

As configured, the ASIC emulator system 90 can use software applications of various types (Eg. Windows 95 based, DOS based, user defined ASIC applications, or future operating system based applications) to the test the overall system operation with a simulated ASIC installed. In addition, the ASIC emulator 90 can also test emulated versions of the driver 114, the driver 118, and the I/0 service module 122. The ASIC emulator 90 can further test the above mentioned components in any combination. As a first example of the capabilities of the ASIC emulator system 90, the ASIC applications 96 will be discussed.

The ASIC application module 96 may store any number of ASIC developer created software applications which are intended to test the functionality of the ASIC. Such functionality testing is typically intended to test the ASIC as a stand alone device, but can be to test the ASIC within the system. The rationale for having ASIC applications being able to run in the system is to insure that the ASIC simulator, or the actual ASIC, is functioning properly, especially if unsatisfactory performance of the overall system is detected. Thus, through this application path, the internal workings of the ASIC can be ruled out, or identified, as the source for the unsatisfactory performance.

To load an ASIC application into the ASIC emulator 28, the client interface module 104 is activated to receive an ASIC application from the ASIC application module 96. The client interface module 104 is, in a sense, a backdoor into the ASIC emulator 28, providing the ASIC developer access to the ASIC that is normally not available to a system developer. Once an ASIC application is received by the client interface module 104, it is provided to the server 106. As the name implies, the server 106 is a server that coordinates applications for the ASIC simulator 88 and the actual ASIC (not shown). The server 106 may be a stand alone digital processing device, or a part of a shared digital processing device of the system. The diagnostic module 108, which is similar to the evaluation module 46 of FIG. 2, monitors the ASIC simulator's 88, or the actual ASIC's, processing of the ASIC application and records any errors, traces, etc. detected.

For a Windows 95 application (which could also be an Apple based application, a UNIX based application, or a Windows NT based application), the Windows 95 GDI 98 receives the application and provides it to the first driver module 86. The command module 110 receives data (which may be data and/or operational instructions) from the Windows 95 GDI and records the receipt of the data. The command module 110 then routes the data to either the installed hardware driver 112 or the driver 114, depending which is available and the desired tests being performed. The outputted data of the driver 112 or 114 is routed to the trapping circuit 16 which provides the virtually coupling to the server application module 102 and subsequently to the ASIC simulator 88 or the actual ASIC for processing. The second driver module 92 operates in a similar manner as the first driver module 86, but for DOS based applications.

Input/output instructions 128 are provided to the I/O command module 124 of the virtual module 42. Such input/output instructions 128 may provide display information, such as brightness, contrast, color patterns, refresh rate, resolution display mode, etc. Such information 128 is routed to either the I/O service simulator 122 or the I/0 hardware module 126, depending on which circuit is to be tested. The I/O command module 124 also records each instruction it receives such that it may be used for subsequent diagnostics.

Figure 7:
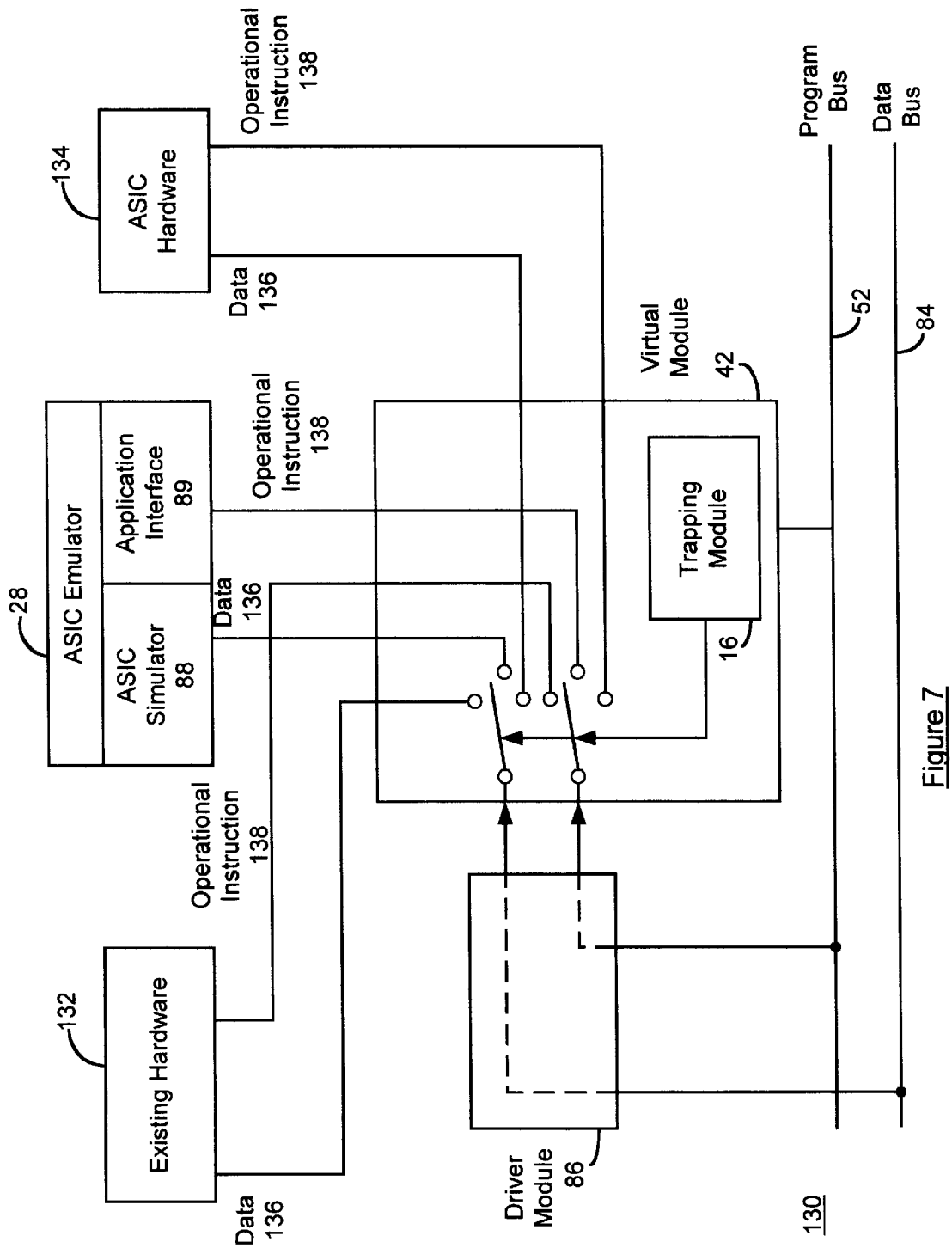
FIG. 7 illustrates a schematic block diagram of another alternate virtual system which is in accordance with the present invention.

FIG. 7 illustrates a schematic block diagram of another alternate virtual system 130 that includes the virtual module 42, the driver module 86, the ASIC emulator 28, existing hardware 132, and ASIC hardware 134. The virtual module 42 is shown to include the trapping circuit 16 and a pair of functional switches. While the basic operation of this virtual system 130 is similar to ones previously discussed, it more clearly illustrates the operation of the trapping circuit 16. As shown, the trapping circuit 16 controls the functional switches, which may be actual switches, firmware implementations, or software implemented switches, to route the data 136 and the operational instructions 138 to any one of the existing hardware (i.e., the currently installed ASIC) 132, the ASIC emulator 28, or the ASIC hardware (i.e., the new ASIC) 134. Such switching is facilitated because each one of the targeted destinations 132, 28, and 134 has its own individual system identifier which the trapping module 16 utilizes to route the information to the appropriate destination.

Figure 8:
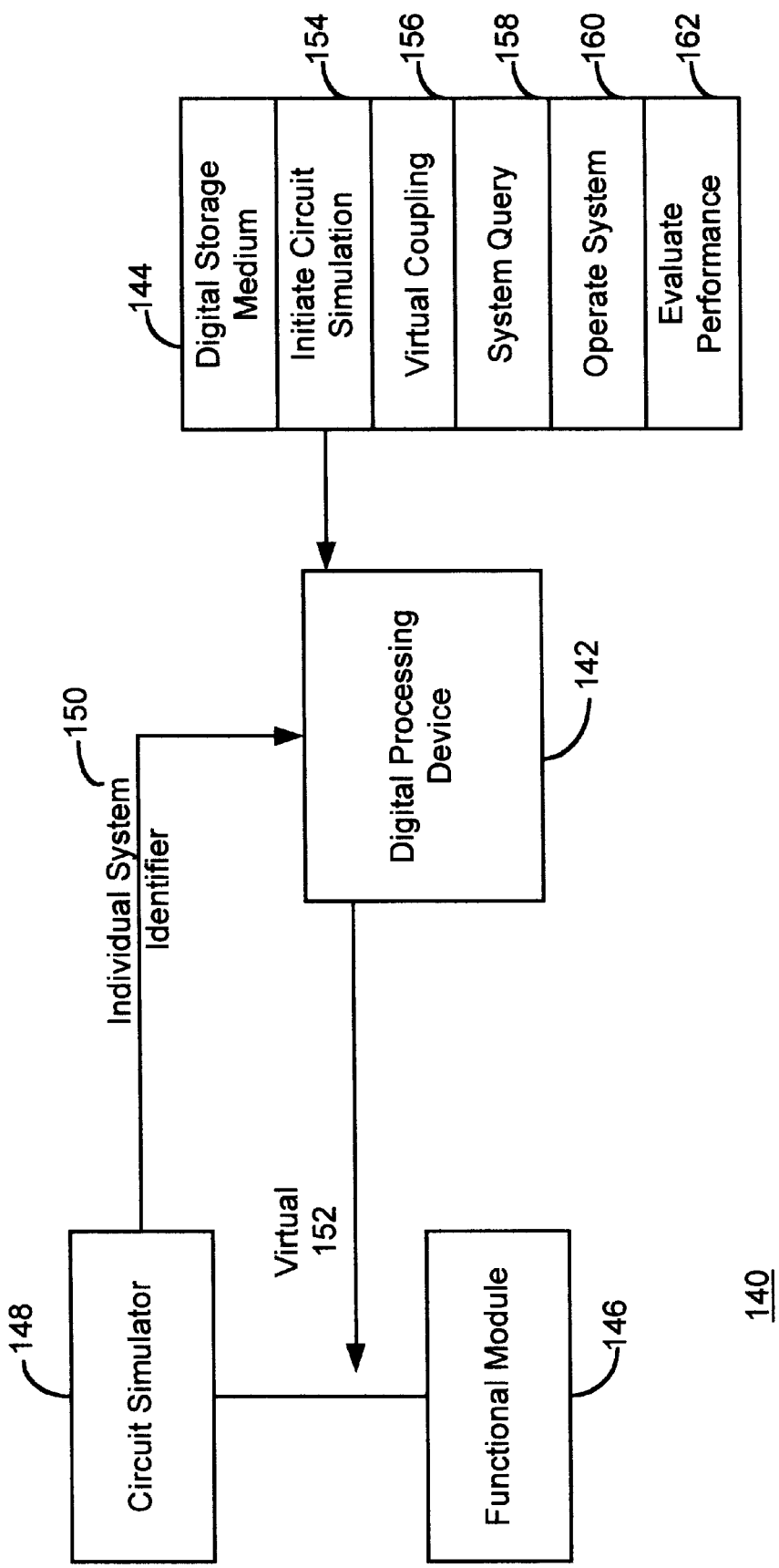
FIG. 8 illustrates a schematic block diagram of a processing system that establishes a virtual system in accordance with the present invention.

FIG. 8 illustrates a schematic block diagram of a processing system 140 that establishes a virtual system. The system 140 includes a functional module 146, a circuit simulator 148, a digital processing device 142, and a digital storage medium 144. The digital storage medium 144 is shown to include a plurality of memory sections 154, 156, 158, 160, and 162 that store programming instructions that, when read by the digital processing device, causes the digital processing device to: initiate functional simulation of a complex circuit by a circuit simulator, wherein the circuit simulator includes an individual system identifier 150; virtually couple at least one functional module to the circuit simulator, wherein the complex circuit and the at least one functional module embody at least a portion of a system; query the system to obtain the individual system identifier of the circuit simulator and to identify the at least one functional module; operate the system based on a pre-defined set of operational instructions; and to evaluate performance of the at least one functional module in combination with the circuit simulator during the operation to detect unsatisfactory performance.

In application, the digital processing device may be contained within the CPU of previously discussed systems and the digital storage medium 144 may be contained within the system memory of the previously discussed systems. Alternatively, the digital processing device may be a stand alone device such as a DSP, microprocessor, microcontroller, mini-computer, computer, or any device that processes digital information based on operational instructions. The digital storage medium 144 may also be a disk, a magnetic tape, a CD, a ROM EPROM, or any other device that stores digital information in volatile or non-volatile manner.

Figure 9:
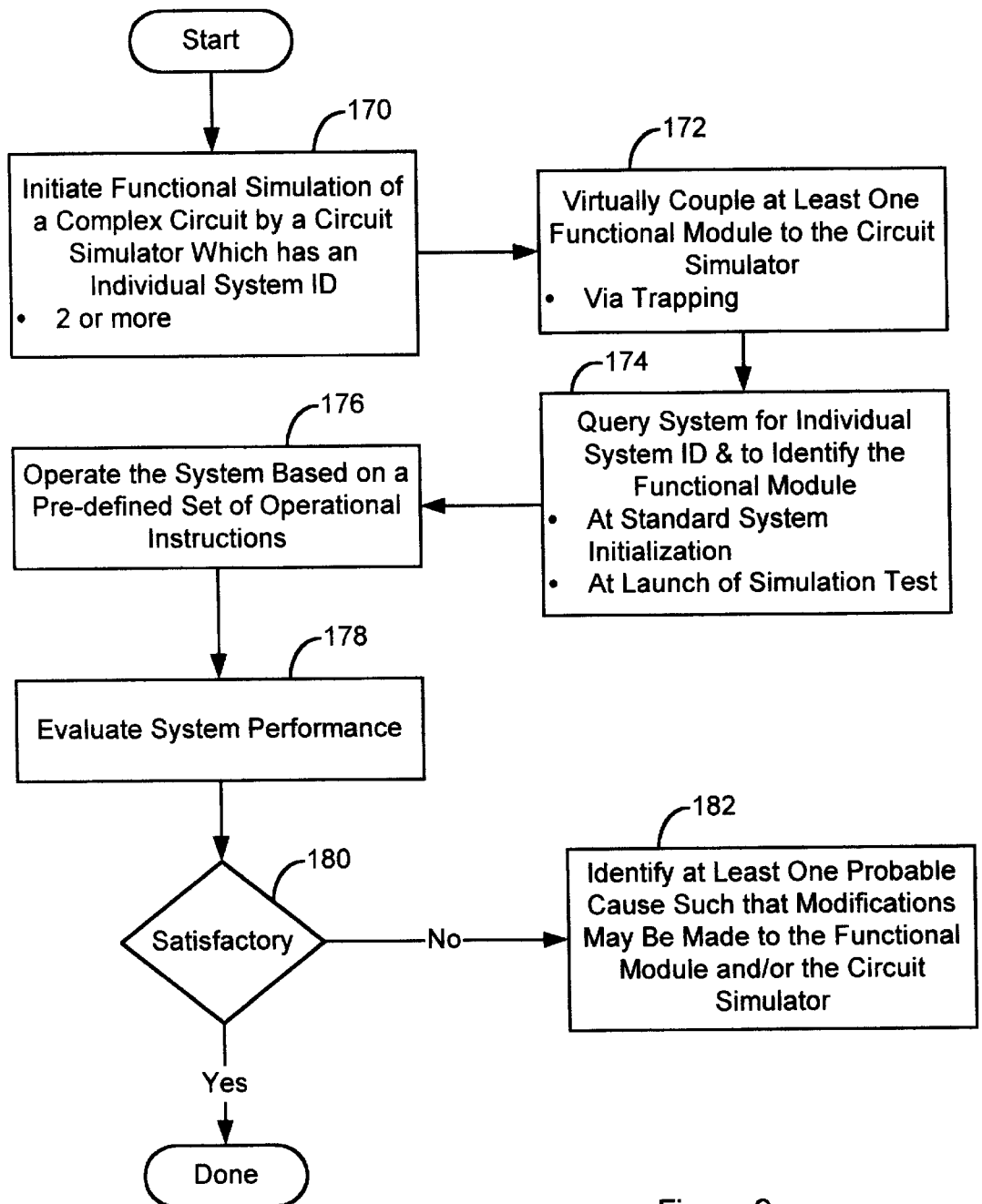
FIG. 9 illustrates a logic diagram that may be used to implement a virtual system in accordance with the present invention.

FIG. 9 illustrates a logic diagram that may be used to implement a virtual system. The process begins at step 170, where a circuit simulator is initiated to perform the functional simulation of a complex circuit. The circuit simulator includes an individual system identifier such that it may accessed as any peripheral device in the system. Note that more than one circuit simulator may be initiated at this step. The process then proceeds to step 172, where the circuit simulator is coupled to at least one functional module. Such virtual coupling may be performed by the trapping circuit as discussed above. The process then proceeds to step 174, where the system is queried to determine the individual system identifier and to identify the functional module. This querying may be done at a standard system initialization, such as the boot-up of a computer, or at the launch of a simulation test.

The process then proceeds to step 176, where the system is operating on a pre-defined set of operational instructions, such as Windows 95 applications, the ASIC applications, or the DOS applications. The process then proceeds to step 178, where the performance of the system is evaluated. The process proceeds to step 180, where it is determined whether the performance of the system is satisfactory. If so, the test is successful and complete. If, however, the performance was unsatisfactory, the process proceeds to step 182, where at least one probable cause of the unsatisfactory performance is identified such that modifications may be made to the functional module and/or the circuit simulator.

As described, the present invention provides a method and apparatus for testing a virtual system, where a virtual system is one that has one or more complex circuits being simulated by an emulator. Such testing can be done without modifying the existing system because each circuit simulator of an emulator is given its own system identification which allows it to be treated as just another peripheral device. The emulator further includes a trapping circuit which monitors the program bus to identify operational instructions intended for the circuit simulator. Having identified such instructions, the trapping circuit virtually couples the circuit simulator to a functional module such that the functional module routes processed information to the circuit simulator and not an existing circuit.

We claim:

1. A method for virtualizing system operation, the method comprising the steps:

a) detecting data or operational instructions for a complex circuit;

b) determining whether a new version of the complex circuit, an old version of the complex circuit, or a circuit simulator of the complex circuit is to receive the data or the operational instructions;

c) when the circuit simulator is to receive the data or the operational instructions, virtually coupling at least one functional module to the circuit simulator, wherein the complex circuit and the at least one functional module embody at least a portion of a system;

d) operating the system based on a pre-defined set of operational instructions; and e) evaluating performance of the at least one functional module in combination with the circuit simulator during the operating step to detect unsatisfactory performance.

2. The method of claim 1 further comprises querying the system to obtain the individual system identifier of the circuit simulator and to identify the at least one functional module by initiating the querying when a standard system initialization process is activated.

3. The method of claim 1 querying the system to obtain the individual system identifier of the circuit simulator and to identify the at least one functional module by initiating the querying when a simulation test is launched.

4. The method of claim 1, wherein step (d) further comprises operating the system utilizing the circuit simulator, wherein the circuit simulator simulates functionality of a video graphics circuit.

5. The method of claim 4, wherein step (d) further comprises virtually coupling a central processing unit, system memory, and a display to the circuit simulator.

6. The method of claim 5 further comprises virtually coupling software applications to the system such that the functionality of the video graphics circuit provides video data to the display.

7. The method of claim 1, wherein step (d) further comprises operating the system utilizing the circuit simulator, wherein the circuit simulator simulates functionality of at least one of: a digital signal processor, a microcontroller, and microprocessor.

8. The method of claim 1, wherein step (d) further comprises establishing the virtual coupling by trapping operational instructions of the pre-defined set of operational instructions for processing by the complex circuit and routing the operational instructions to the circuit simulator.

9. The method of claim 1, wherein step (d) further comprises virtually coupling the circuit simulator to at least one of: a device driver, a software application, firmware, and micro-code.

10. The method of claim 1 further comprises, when the unsatisfactory performance is detected, identifying at least one probable cause of the unsatisfactory performance such that modifications may be made to at least one of: the at least one functional module and the circuit simulator.

11. The method of claim 1 further comprises:

simulating functionality of a second complex circuit by a second circuit simulator, wherein the second circuit simulator includes a second individual system identifier;

virtually coupling the second circuit simulator to at least one of: the at least one functional module and the circuit simulator;

querying the system to obtain the second individual system identifier;

evaluating performance of the second circuit simulator in combination with at least one of: the at least one functional module and the circuit simulator.

12. A virtual system comprising:

circuit simulator that simulates the functional operations of a complex circuit, wherein the circuit simulator includes an individual identifier;

functional module that performs an interface function for the circuit simulator;

virtual coupling means for providing virtual coupling between the functional module and one of the circuit simulator, a new ASIC, or an existing ASIC, wherein, when the circuit simulator is used, the virtual coupling is based on identifying operational instructions intended for the new ASIC or the existing ASIC and routing, via the functional module, the operational instructions to the circuit simulator; and evaluation means, operably coupled to the functional module and the circuit simulator, for evaluating interoperation of the circuit simulator and the functional module to detect unsatisfactory performance.

13. The virtual system of claim 12, wherein the circuit simulator simulates a video graphic processor and the functional module functions as a video driver.

14. The virtual system of claim 13 further comprises:

a central processing unit operably coupled to the virtual coupling means, wherein the virtual coupling means virtually couples the central processing unit to circuit simulator;

system memory operably coupled to the central processing unit; and a display operably coupled to the virtual coupling means, wherein the virtual coupling means virtually couples the display to the circuit simulator.

15. The virtual system of claim 12 further comprises:

a second circuit simulator that simulates the functional operations of a second complex circuit on second operand data, wherein the second circuit simulator includes a second individual identifier; and a second functional module that performs an interface function for the second circuit simulator; and wherein the virtual coupling means further functions to provide virtual coupling between the second circuit simulator and the second functional module.

16. A virtual system comprising:

an Application Specific Integrated Circuit (ASIC) emulator that includes;

an ASIC simulator that simulates operation of the ASIC;

application interface operably coupled to the ASIC simulator;

an existing ASIC portal that enables the ASIC emulator to further include an existing ASIC; and a new ASIC portal that enables the ASIC emulator to further include a new ASIC;

a driver module operably coupled to provide a driver interface for the ASIC emulator; and virtual module operably coupled to the ASIC emulator and the driver module, wherein the virtual module includes a trapping module that detects operational instructions intended for the new ASIC or the existing ASIC and provides, via the driver module, the operational instructions and operand data to the ASIC simulator.

17. The virtual system of claim 16 further comprises a second driver module, wherein either of the driver module and the second driver module supports at least one of: Windows 95™, DOS, Apple operating system, UNIX, and Windows NT™.

18. The virtual system of claim 16 further comprises, within the application interface, a server application module;

a server operably coupled to the server application module;

a diagnostic module operably coupled to the server; and a client interface module operably coupled to the server and to receive an ASIC application.

19. The virtual system of claim 16 further comprises, within the driver module, a command module that receives driver interface instructions, records receipt of the driver interface instructions, and routes the driver interface instructions to either an installed hardware driver of the driver module or to an emulation driver of the driver module.

20. The virtual system of claim 16 further comprises, within the virtual module, an input/output service simulator operably coupled to the trapping module and an input/output command module that receives input/output instructions and routes the input/output instructions to either an installed hardware input/output module or to a simulated input/output module.

21. The virtual system of claim 16 further comprises a diagnostic module that tests inter-operation of the ASIC simulator and the driver emulator, and, when the interoperation is unsatisfactory, determines a probable cause for the unsatisfactory interoperation such that modifications may be made to at least one of the ASIC simulator and the driver module.

22. The virtual system of claim 16 further comprises, within the driver module, switching means, operably coupled to the ASIC simulator and ASIC hardware, for switching, based on system configuration instructions, between the ASIC simulator and the ASIC hardware.

23. The virtual system of claim 16 further comprises, within the driver module, switching means, operably coupled to the ASIC simulator and existing hardware, for switching, based on system configuration instructions, between the ASIC simulator and the existing hardware.

24. A digital storage medium for storing programming instructions that, when read by a digital processing device, causes the digital processing device to perform a virtual system, the digital storing means comprising:

first means for storing programming instructions that, when read by the digital processing device, causes the digital processing device to detect data or operational instructions for a complex circuit;

second means for storing programming instructions that, when read by the digital processing device, causes the digital processing device to determine whether a new version of the complex circuit, an old version of the complex circuit, or a circuit simulator of the complex circuit is to receive the data or the operational instructions;

third means for storing programming instructions that, when read by the digital processing device, causes the digital processing device to virtually couple at least one functional module to the circuit simulator when the circuit simulator is to receive the data or the operational instructions, wherein the complex circuit and the at least one functional module embody at least a portion of a system;

fourth means for storing programming instructions that, when read by the digital processing device, causes the digital processing device to operate the system based on a pre-defined set of operational instructions; and fifth means for storing programming instructions that, when read by the digital processing device, causes the digital processing device to evaluate performance of the at least one functional module in combination with the circuit simulator during the operation to detect unsatisfactory performance.

* * * * *